US006228696B1

(12) United States Patent
Nguyen et al.

(10) Patent No.: US 6,228,696 B1
(45) Date of Patent: May 8, 2001

(54) SEMICONDUCTOR-OXIDE-SEMICONDUCTOR CAPACITOR FORMED IN INTEGRATED CIRCUIT

(75) Inventors: Bai Nguyen; Bradley A. Sharpe-Geisler, both of San Jose, CA (US)

(73) Assignee: Vantis Corporation, San Jose, CA (US)

( * ) Notice: Subject to any disclaimer, the term of this patent is extended or adjusted under 35 U.S.C. 154(b) by 0 days.

(21) Appl. No.: 09/187,691

(22) Filed: Nov. 5, 1998

(51) Int. Cl.[7] ............................................. H01L 21/8238
(52) U.S. Cl. ................................. 438/217; 438/301
(58) Field of Search .................................... 438/968, 131, 438/600, 200, 210, 244, 217, 299, 300, 301, 218; 257/379, 356; 357/51; 361/111

(56) References Cited

U.S. PATENT DOCUMENTS 4,922,319 * 5/1990 Fukushima .............................. 357/51
5,523,603 * 6/1996 Fishbein et al. ...................... 257/356

* cited by examiner

*Primary Examiner*—Matthew Smith
*Assistant Examiner*—Calvin Lee
(74) *Attorney, Agent, or Firm*—Fliesler, Dubb, Meyer & Lovejoy LLP

(57) ABSTRACT

An integrated capacitor structure includes first and second, conductive semiconductor portions spaced apart from one another where the first and second semiconductor portion are both of a same conductivity type (both N or both P). The integrated capacitor structure may be formed using same processes as are used for fabricating gate insulator and gate electrode parts of neighboring MOS transistors in a same integrated circuit.

22 Claims, 5 Drawing Sheets

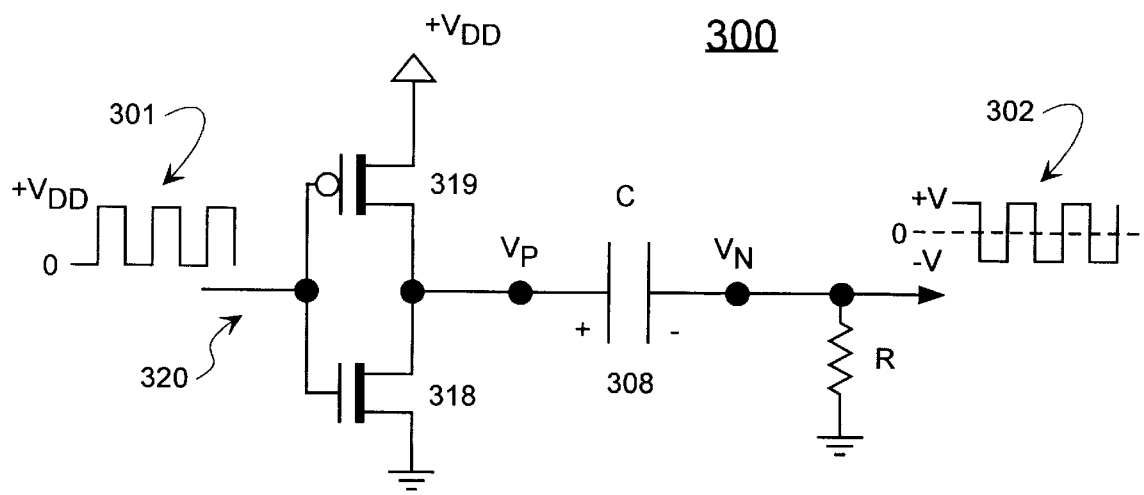
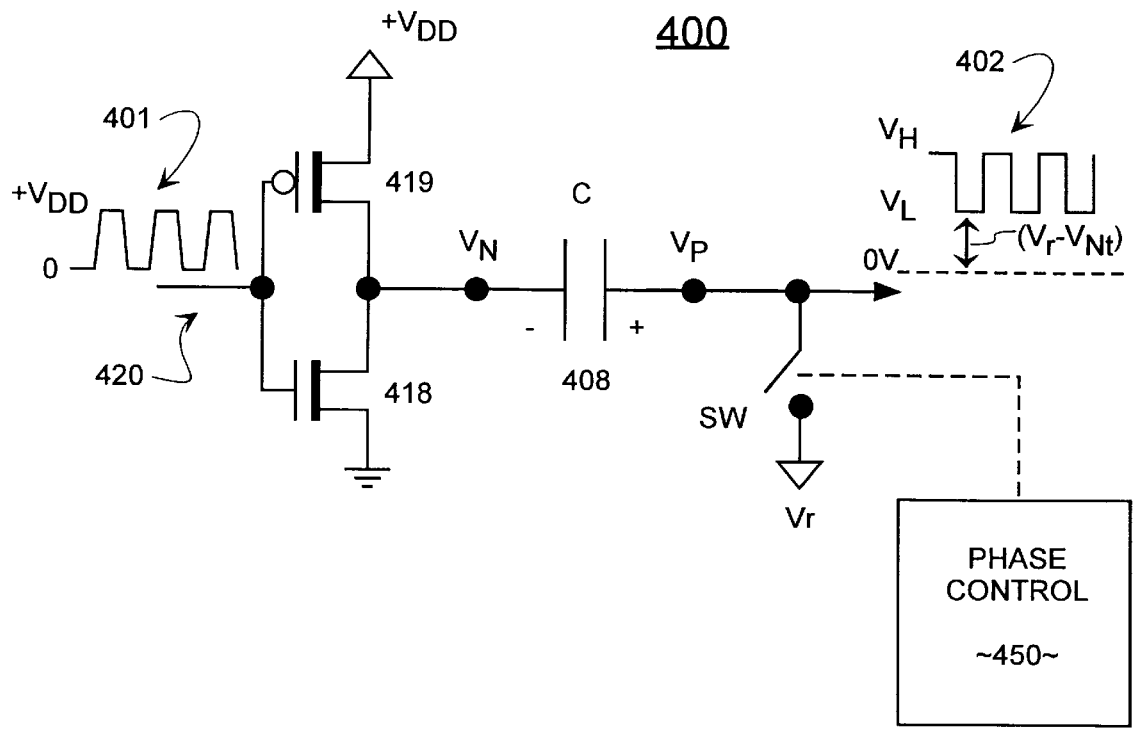

SEMICONDUCTOR-OXIDE-SEMICONDUCTOR CAPACITOR FORMED IN INTEGRATED CIRCUIT

BACKGROUND

1. Field of the Invention

The invention relates generally to integrated circuits. The invention relates more specifically to the formation of a capacitor within an integrated circuit that has MOS transistors.

2. Description of the Related Art

It is often desirable to define capacitive elements within integrated circuits. A variety of different approaches have been developed. For example, two spaced-apart layers of metal interconnect may be used to form opposed plates of a capacitor. The insulator material between the two metal layers may be used as the dielectric. Such a metal-insulator-metal (MIM) capacitor can provide most of the desired characteristics of an ideal capacitor. In particular, such a MIM capacitor can have the ability to retain charge of either a positive or negative polarity without concern for which of the capacitor plates has the more positive or negative voltage.

When implemented in an integrated circuit, such a MIM capacitor has several drawbacks however. First, the thickness of the insulator between the metal layers tends to be relatively large. This may mean that relatively large amounts of metal area will be required for providing the MIM capacitor with a predefined, large amount of capacitance because capacitance is inversely proportional to dielectric thickness and directly proportional to plate area. Use of such large amounts of metal area may disadvantageously take away from the finite amount of metal area in the IC device. It is likely that the consumed metal area could have been otherwise put to better use for defining fine-pitch interconnect conductors of the integrated circuit. Metal interconnect tends to be a valuable resource that should not be squandered. Another drawback is that vias may be necessary for coupling terminals of the in-metal capacitor to other components in the substrate or first polysilicon layer of the IC device.

In an alternate approach, a capacitive element may be formed by shorting together the in-substrate drain and source regions of an NMOS or PMOS field effect transistor. These tied together transistor regions form part of an in-substrate first plate while the transistor's gate electrode defines an opposed second plate of a resulting, bipolar capacitor. The gate oxide defines the capacitor's dielectric. This shorted drain-source approach has the advantage of using the thin gate oxide of the IC device for providing greater values of capacitance. The shorted drain-source approach can advantageously avoid use of the scarce resources of metal layers if its connections are made entirely in the gate and substrate layers.

Unfortunately, the shorted drain-source capacitor has a shortcoming. The area of its in-the-substrate plate (the one formed by the tied-together source and drain) is typically intended to include the area of the transistor's conductive channel. Such a conductive channel is induced in the normally-depleted region below the gate and between the source and drain of the MOS transistor by appropriate gate-to-source biasing. And that is where the problem arises. If the shorted drain-source capacitor is expected to exhibit a maximum amount of capacitance—for the area consumed by the MOS transistor—then the gate-to-source voltage ($V_{GS}$) of the transistor must be consistently maintained above threshold. This threshold ($V_T$) is an inherent voltage of the MOS transistor which is needed to maintain the channel in the conductive or nondepleted state. However, if the voltage across the shorted drain-source capacitor modulates so as to extend into a region where the above-threshold condition ($V_{GS} > V_T$) is not maintained, the channel region depletes and the amount of capacitance changes substantially.

Design situations arise for which it is desirable to define within an IC device, a capacitor of essentially fixed capacitance where voltage across that capacitor is expected to swing through a voltage that constitutes threshold ($V_T$) for at least one conductivity-type of transistor (NMOS or PMOS) in the same IC device. More specifically, design situations may arise for which the voltage across the desirably-fixed capacitance element is expected to swing at least between 0V and $+V_{DD}$, where the latter range contains the threshold levels ($V_{TN}$, $V_{TP}$) of at least two different conductivity-types of transistors (NMOS and PMOS) in the same IC device. The traditional shorted source-drain NMOS or PMOS capacitor may not be useable in such situations because the gate-to-source voltage ($V_{GS}$) will drop below threshold ($V_{GS} < V_T$) as capacitor voltage crosses dynamically through one or the other of the threshold values, $V_{TN}$ and $V_{TP}$. The capacitance of the shorted source-drain MOS capacitor will then change significantly due to depletion of its channel.

The alternative use of a metal-insulator-metal (MIM) capacitor for such situations suffers the drawbacks noted above. As such, neither the MIM capacitor nor the shorted source-drain MOS capacitor provides an attractive solution.

SUMMARY OF THE INVENTION

An SOS capacitor in accordance with the invention overcomes the above problems. Such an SOS capacitor is defined by a sandwich of semiconductor-oxide-semiconductor layers where the opposed semiconductor layers both have an abundance of a same charge carrier (e.g., electrons).

In one embodiment, the first polysilicon layer of a CMOS integrated circuit defines an upper plate of the SOS capacitor, the gate oxide defines the insulator and an implanted well within the substrate defines the opposed plate. The implanted well has the same conductivity as that of the first polysilicon layer, meaning that they are either both of N type conductivity or both of P type conductivity.

Such an SOS structure may be efficiently fabricated at the same time and with most of the same process steps that are used for fabricating neighboring MOS transistors of the IC device. In other words, the SOS capacitor may utilize the same thin gate oxide for its dielectric as is used for forming the gate-to-channel isolation of neighboring MOS transistors. The SOS capacitor may utilize the same conductive gate layer (typically, the 'poly-one' layer) for its upper plate as is used for forming the gate electrodes of neighboring MOS transistors. Doping of the upper plate of the SOS capacitor may occur at the same time and with the same process used for doping the gate electrodes of neighboring MOS transistors.

Other aspects of the invention will become apparent from the below detailed description.

BRIEF DESCRIPTION OF THE DRAWINGS

The below detailed description makes reference to the accompanying drawings, in which:

FIG. 3 is a schematic diagram of a high-pass filter circuit employing an SOS capacitor in accordance with the invention;

FIG. 4 is a schematic diagram of a level shifting circuit employing an SOS capacitor in accordance with the invention;

DETAILED DESCRIPTION

Figure 1:
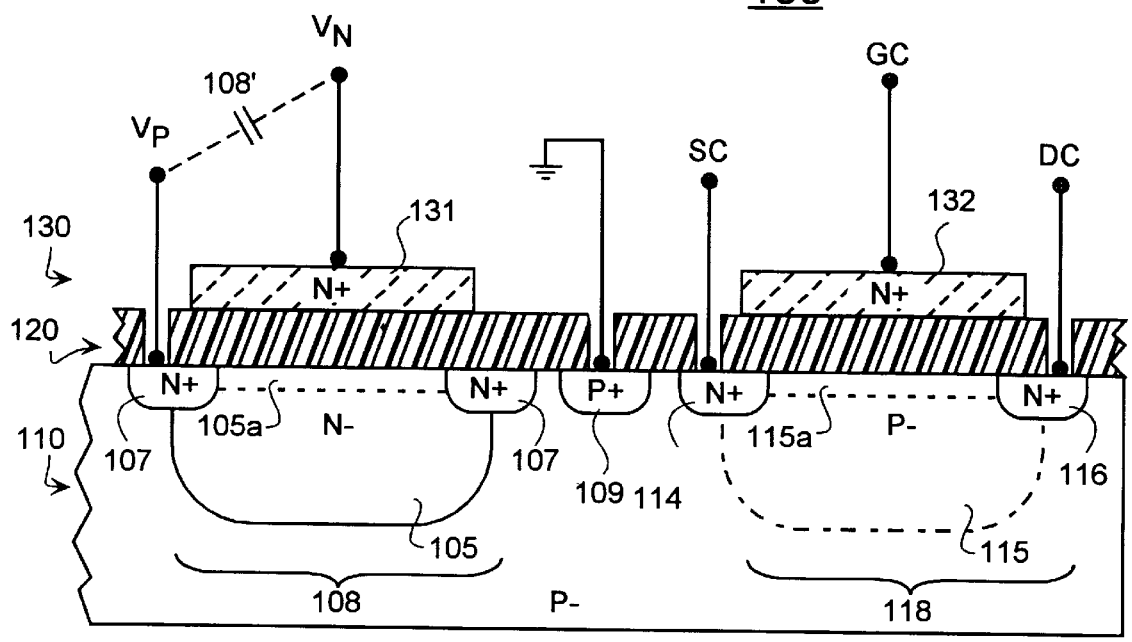
FIG. 1 is a cross-sectional side view of a first integrated circuit (IC) device in accordance with the invention having an SOS capacitor.

FIG. 1 provides a cross-sectional side view of an integrated circuit device 100 in accordance with the invention. Device 100 includes a semiconductor substrate 110 composed in bulk, for example, of monocrystalline silicon. (Other semiconductor materials such as GaAs may be used instead.) A gate insulator layer 120 composed, for example, of thermally-grown silicon dioxide is defined on an upper major surface of substrate 110. A gate electrode layer 130 (also referred to herein as gate layer 130) is formed on top of the insulator layer 120, for example, from CVD-deposited polysilicon. Gate layer 130 includes a first patterned portion 131 and a second patterned portion 132. An example of the possible patterning is seen in the top planar view of FIG. 2. The patterning shown in FIG. 2 does not, of course, limit the number of embodiments covered by FIG. 1. The top planar view of FIG. 2 and the side sectional view of FIG. 1 are generally not to scale.

In the embodiment of FIG. 1, a bulk portion of the substrate 110 is lightly doped to have a P– conductivity type. A first well-implanting process defines within substrate 110, a well 105 having an opposed, N– conductivity. The N– well 105 is located so as to be positioned overlapping-wise below the first patterned portion 131 of the gate layer 130. This N– well 105 should be capable of supporting therein, a nondepleted or 'electron rich' region 105a immediately below and adjacent to insulator layer 120.

After gate layer 130 is formed, with its patterned first region 131 being defined above the N– well 105, a second implanting process uses a higher dose of N type dopants (e.g., phosphorous) to provide a heavily doped, N+ conductivity in the first gate-layer portion 131. This process simultaneously produces a self-aligned, N+ contact region 107 overlapping with the periphery of N– well 105. The same N+ implant process may simultaneously define self-aligned source and drain regions, 114 and 116, for an NMOS field effect transistor that includes gate electrode 132. A P– channel region 115a is defined immediately below insulator layer 120 between the source and drain regions 114 and 116. As will be understood by those skilled in the art, the combination of elements 114, 115a, 116 and 132 defines an N-channel MOS FET device generally denoted herein as 118. Where desired, appropriate contacts may be made to the source, drain and gate portions of the transistor 118 by using conventional contact means, denoted herein respectively as SC, DC, and GC. Also, threshold implants may be made into channel region 115a if desired.

As will be understood by those skilled in the art, portions 131 and 132 of gate layer 130 may have essentially same thicknesses and employ essentially same materials that are simultaneously disposed on insulator layer 120 with a common fabrication process. Similarly, the portion of insulator layer 120 that separates gate layer portion 131 from the left-side N– well 105 may have essentially a same thickness and employ essentially same materials as are used for defining the gate insulator of the neighboring NMOS transistor 118. A dashed region 115 is drawn in FIG. 1 as a counterpart to solidly-drawn region 105 to make the point that the conductivity type of the left-side N well 105 is opposite to that which is normally provided in its counterpart region 115. In other words, transistor design rules are intentionally violated. The left-side device denoted as 108 cannot function as an enhancement-mode, NMOS transistor.

The sandwich structure defined by N+ portion 131, gate insulator 120, and N– well 105 instead creates a semiconductor-oxide-semiconductor (SOS) capacitor. This capacitor is generally denoted herein as 108. A schematic symbol for the capacitor is shown at 108'. If the voltage relationship, $V_N \geq V_P$ is maintained (where $V_N$ is a voltage of the N+ gate-layer portion 131, and $V_P$ is a voltage of the in-substrate plate portion 107/105a), the nondepleted region 105a should remain rich with electrons and should thus be able to behave in a manner somewhat similar to a metal capacitor plate. As long as N region 105a does not become depleted of its majority carriers (electrons) it remains conductive. The N+ electrode 131 is even more rich with the same majority carriers (electrons) and thus also behaves similar to a metal capacitor plate.

In the preferred embodiment, SOS capacitor 108 is manufactured without adding additional implant steps or masking steps to the manufacture of the overall integrated circuit chip (110). N– well 105 is formed at the same time and with same implant dosages/energies as used for forming N– wells (not shown) of neighboring PMOS transistors. The N+ doping of N+ contact region 107 and gate-layer portion 131 is performed at the same time and with same implant dosages/energies as used for forming N+ source/drains (114/116) and gate electrodes 132 of neighboring NMOS transistors, e.g. 118. Thus, there is no additional cost for more masking or implant steps and the same dosages are used as are found appropriate for neighboring devices. The introduction of N– well 105 into a region that might otherwise be P– and thereby might otherwise define another NMOS device such as 118, works to shift the $V_{GS}$ depletion voltage of channel region 105a (or the $V_{NP}$ depletion voltage thereof, to be more accurate) toward a more negative value. This works to assure that channel region 105a does not become depleted over the working range of $V_{NP}$ voltages seen by SOS capacitor 108.

Variations are of course possible. For example, channel region 105a may be modified to be moderately N doped or even heavily N+ doped prior to formation of gate layer 130 so as to further assure that region 105a will not become depleted of its majority carriers even if the relative voltage, $V_{NP}=V_N-V_P$, goes more than slightly negative. (See FIG. 7B.) However, this heavier doping may degrade the dielectric characteristics of the next thermally-grown, gate layer 130. So care should be taken if such alterations are carried out. Also, the different doping of channel region 105a may call for extra masking and/or implant steps which may disadvantageously drive the manufacturing costs of the device higher. As another alternative, gate portion 131 may be doped lighter so as to be N−. This however may increase the series resistance of the capacitor element 108. It may also disadvantageously call for extra masking and/or implant steps.

As yet another alternative, a central part of gate portion 131 may be doped heavily as P+ so as to attract more electrons into the underlying portion of N− region 105a. A silicide (self-aligned siliciding) process, such as one that adds Ti or TiN to the top of 131, may be used to define a silicide strap for tying together the P+ central portion (not shown) and N+ outer portions of this alternate, top electrode 131. Again, such a P+ doping step may create problems due to high sideways diffusion rates of boron in polysilicon. Care should be taken against deleterious effects if such an alteration is carried out. Also, the different doping of gate-layer portion 131 may call for extra masking and/or implant steps which may disadvantageously drive the manufacturing costs of the device higher. So to summarize, the minimal-impact approach that is depicted by 108 is more preferred.

Also, of course conductivity types may be reversed for structure 108. That would lead to a P+ version of 131 over a P− version of 105 and a P+ version of 107. The P− version of 105 may be formed by not performing a N− well implant. Alternatively, the P− version of 105 may be formed by implanting P dopants into a pre-formed N− well. The disadvantage of such a P-channel device is that hole mobility is less than electron mobility and thus the corresponding capacitor element would have a lower frequency range of operativeness than the N-channel device 108 shown in FIG. 1. In some unique applications this might be desirable. In general, it is not.

As indicated above, the voltage of the illustrated N+ polysilicon portion 131 of SOS capacitor 108 is denoted herein as $V_N$. The voltage of the peripheral contact region 107 is denoted herein as $V_P$. In-substrate channel region 105a may remain rich in majority carriers (in other words, remain nondepleted) provided the following relationship {Eq. 1} is maintained:

$$V_N > V_P - V_{Deplete} \qquad \{Eq. 1\}$$

where $V_{Deplete}$ is a process constant that defines how negative $V_N$ can be relative to $V_P$ before lower plate region 105a becomes depleted of its charge carriers.

In one embodiment $V_{Deplete}$ (=$V_P-V_N$) has the value of approximately 0.8 volts. In other words, $V_N$ can go as much as approximately 0.8V negative relative to $V_P$ before the capacitance of SOS capacitor 108 begins to drop off due to depletion in region 105a. The process parameters of this embodiment include a silicon dioxide gate layer 120 having a thickness of 60 Å (Angstroms) and a minimum drawn, source-to-drain channel length of 0.25 microns. The implant process for forming the N− well 105 has three steps. First, phosphorous is implanted at an energy of 800 Kev with a doping density of $3 \times 10^{13}$ doping atoms per centimeter (3 E13). Second, the same N-type dopant is implanted at an energy of 350 Kev with a doping density of 3 E12. Lastly, the same dopant is implanted at an energy of 250 Kev with a doping density of 4 E12. This last, lower-energized implant, gives upper region 105a a greater amount of majority charge carriers (free electrons) than provided for deeper in well 105.

In the same embodiment, the N+ doping of contact ring 107 and source-drain regions 114, 116 is performed with an arsenic implant at 80 Kev with a doping density of 2 E15. If desired, a P+, ground contact region 109 may be further formed in substrate 110 as may P− channel transistors so as to create CMOS circuitry (complementary metal-oxide-semiconductor).

It is within the contemplation of the invention to form in-substrate connections between SOS capacitor 108 such that, when appropriate for a particular circuit design, N+ region 107 extends continuously into one of N+ regions 114 and 116. It is further within the contemplation of the invention to similarly form connections in the gate layer 130 by having the upper-plate portion 131 of the SOS capacitor 108 extend continuously into a gate portion of a neighboring transistor, such as into gate portion 132.

Figure 2:
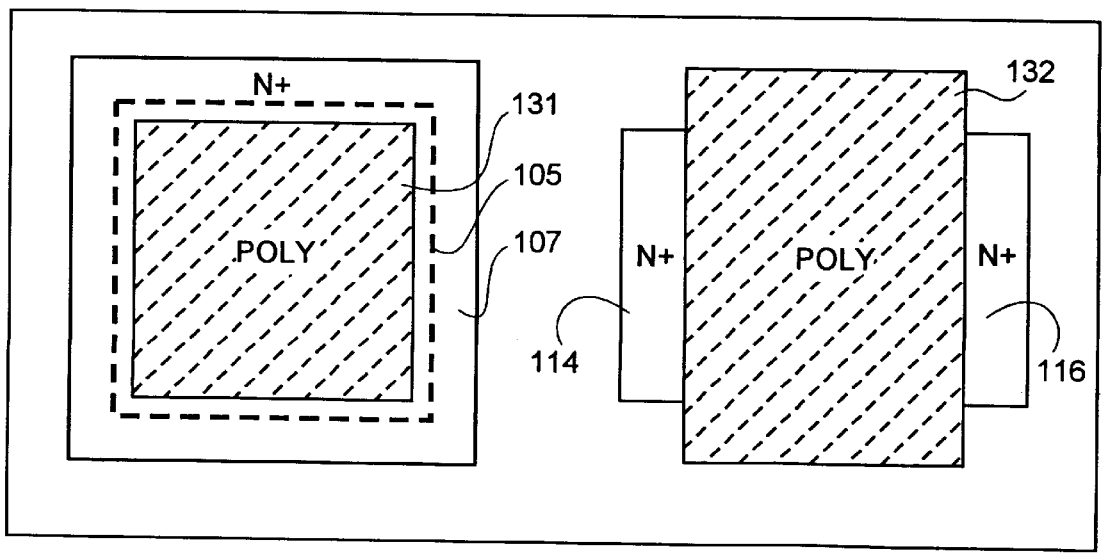
FIG. 2 is a top view of the first IC device showing the SOS capacitor and an adjacent N-channel transistor.

FIG. 2 shows one possible top view of the device 100 of FIG. 1. Here, polysilicon region 131 is patterned as a square area. The larger and surrounding, dashed square represents the peripheral boundary of the N− well 105. N+ contact region 107 defines a protective square ring provided about the capacitor structure. If voltage $V_P$ is made relatively positive to the P− substrate 110, the junction between N+ region 107 and P− substrate 110 becomes reverse-biased, thereby isolating the lower capacitor plate from the substrate. If such isolation is called for by the circuit design, then in addition to Eq. 1, the following relationship {Eq. 2} should be maintained:

$$V_P \geq V_{109} \qquad \{Eq. 2\}$$

where $V_{109}$ is the voltage of the P− bulk portion of the substrate (typically ground).

The MOS transistor 118 of FIG. 1 appears in FIG. 2 as the traditional pattern of a polysilicon line 132 crossing through between two N+ implant regions, 114 and 116.

FIG. 3 illustrates a first possible application 300 for an SOS capacitor 308 in accordance with the invention. SOS capacitor 308 is understood to have a structure such as depicted by FIG. 1. In FIG. 3, a CMOS inverter 320 is formed by NMOS transistor 318 and PMOS transistor 319 and connected to receive an input pulse train 301. The input pulse train 301 has it low levels at or close to 0V (ground) and its high levels at or close to power rail voltage, +$V_{DD}$. CMOS inverter 320, incidentally, is integrally formed within the same integrated circuit, monolithic device as is SOS capacitor 308 and an attached resistor, R. Capacitor 308 and resistor R define a high-pass RC filter for the output of CMOS inverter 320. (Resistor R may formed by an NMOS transistor of the IC where the gate and drain of the transistor are strapped together.) As will be understood by skilled artisans, the voltage across capacitor 308 (also denoted as capacitor C) achieves a steady state value equal to the DC average of the output waveform of inverter 320 (which output appears at node $V_P$ essentially as an inversion of waveform 301). In this particular example, the $V_N$ plate of SOS capacitor 308 will be negatively charged relative to the $V_P$ plate in the steady state. The output voltage 302 oscillates above and below 0V (ground), between +V and −V. The lower output level, −V should not cause $V_{NP}$ to go below the $-V_{Deplete}$ value of Eq. 1. An advantage of the construction used in FIG. 3 is that the $V_P$ plate of capacitor 308 can be directly connected within the substrate (110) to the drains of CMOS transistors 318, 319.

FIG. 4 illustrates a second possible application circuit 400 for an SOS capacitor 408 in accordance with the invention. Here again, a CMOS inverter 420 is formed by N transistor 418 and P transistor 419 both within the same IC as SOS capacitor 408. The input pulse train 401 again has its low levels at or close to 0V (ground) and its high levels at or close to power rail voltage, $+V_{DD}$. Input pulse train 401 is shown to have some amount of skew on the leading and falling edges of its pulses.

A normally-open switch SW is provided with a first end of the switch SW coupled to the $V_P$ plate of SOS capacitor 408 and a second end coupled to a reference voltage, $V_r$. The normally-open switch SW may be defined by a pass transistor, a transmission gate, or another appropriate means for providing high speed, momentary coupling to the reference voltage, $V_r$.

The $V_N$ plate of SOS capacitor 408 is coupled to the output of CMOS inverter 420. Switch SW is momentarily closed by phase-control circuit 450 on a periodic basis so as to charge SOS capacitor 408 with the instant difference between reference voltage $V_r$ and the voltage at node $V_N$. The stored voltage of capacitor 408 is thereafter added in series with the output voltage of inverter 420 to define the levels of output pulse train 402. Reference voltage $V_r$ can be either a static level or itself, a time-varying signal.

By way of example, assume reference voltage $V_r$ is positive (e.g., $+V_{DD} > V_r > 0$) and and the instant voltage $V_{Nt}$ at node $V_N$ is 0V at the moment, t, that switch SW temporarily closes and then opens again. In this particular example, the $V_N$ plate of SOS capacitor 408 will be negatively charged relative to the $V_P$ plate by the amount, $-(V_r-0)=-(V_r-V_{Nt})$. Stated otherwise, at time point, t; $V_P-V_N=(V_r-V_{Nt})$. Until the next time switch SW temporarily closes, the output voltage of inverter 420 will be level shifted by the stored amount of capacitor C (408) to define output waveform 402.

Of course, the next time switch SW temporarily closes the instant voltage $V_{Nt}$ may be a different value. If $V_{Nt}$ is greater than reference voltage $V_r$ at that next time, then the polarity across SOS capacitor 408 will reverse. In other words, the $V_N$ plate of SOS capacitor 408 will be positively charged relative to the $V_P$ plate. This is the reason why it is desireable to have an integrated capacitor structure that can be polarized in two directions. The integrated capacitor structure 108 of FIG. 1 can do this as long as the $V_N$ plate does not become too negative relative to the $V_P$ plate so as to cause depletion of channel region 105a. (See FIG. 1.)

The circuit 400 of FIG. 4, incidentally, may be used in a phase-detecting portion of a phase locked loop (PLL). The PLL circuit may further include a voltage controlled oscillator (VCO, not shown) that responds to output waveform 402.

Figure 5A:
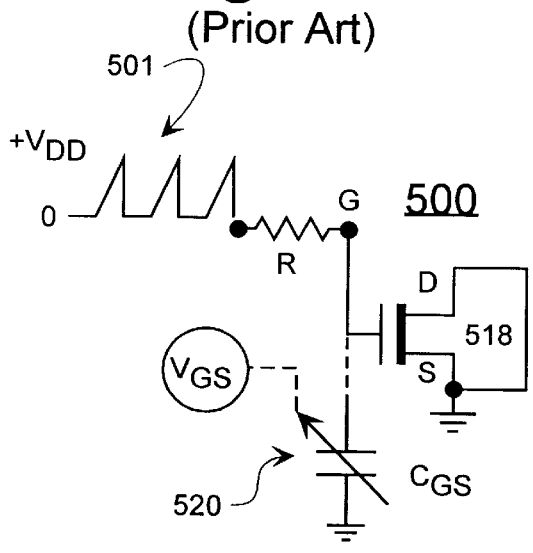
FIG. 5A is a schematic diagram of a conventional, NMOS capacitor circuit.

FIG. 5A is a schematic diagram showing a conventional RC circuit 500 that employs an NMOS transistor 518 for implementing the capacitor part of the RC circuit 500. As seen, the source (S) and drain (D) of NMOS transistor 518 are both tied to ground while the gate (G) of the transistor is coupled to resistor R. Schematic symbol 520 is not part of the RC circuit 500 but rather is an alternate way of representing the variable capacitance element that is defined by NMOS transistor 518. The gate-to-source capacitance ($C_{GS}$) generally varies as a function of gate-to-source voltage ($V_{GS}$).

Figure 5B:
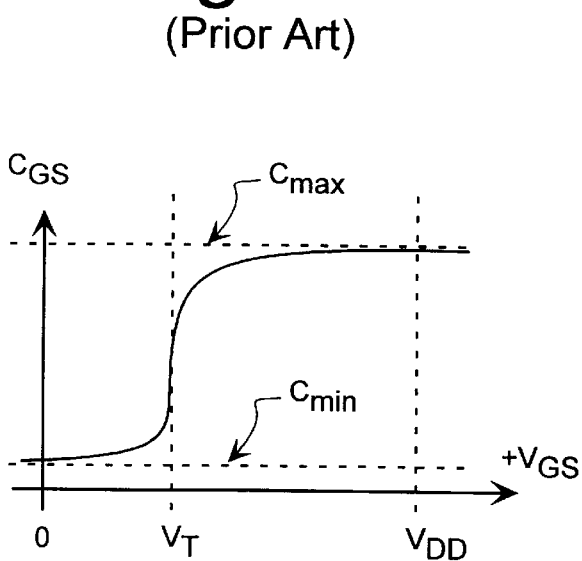
FIG. 5B is a graph of $C_{GS}$ (gate-to-source capacitance) versus $V_{GS}$ (gate-to-source voltage) showing change of capacitance around $V_T$ for the NMOS capacitor circuit of FIG. 5A.

FIG. 5B is a graph showing in general the interdependence between $C_{GS}$ and $V_{GS}$ for circuit 500. If $V_{GS}$ is substantially above threshold point $V_T$, then the channel of NMOS transistor 518 is in its turned-on or carrier-populated state and $C_{GS}$ should be at its maximum value $C_{max}$. On the other hand, if $V_{GS}$ is at or below $V_T$, then capacitance $C_{GS}$ swings toward a minimum value $C_{min}$ due to depletion of charge carriers from the transistor's channel region.

If a full-range input signal such as 501 is presented to the RC circuit 500, where the supplied signal 501 includes voltage transitions through the $V_T$ point such as, for example, from 0V up to $+V_{DD}$; then $C_{GS}$ (FIG. 5B) may modulate in value between $C_{min}$ and $C_{max}$ as $V_{GS}$ swings below and above $V_T$. ($C_{min}$, incidentally, is a minimum inherent capacitance attributed to the minimum capacitive coupling between the gate node, the source node and the bulk of the integrated circuit substrate 110.) If input signal 501 operates only in the range between 0V and just below $V_T$, then $C_{GS}$ will remain in its minimum value of $C_{min}$ rather than attaining its maximum value, $C_{max}$.

Figure 6A:
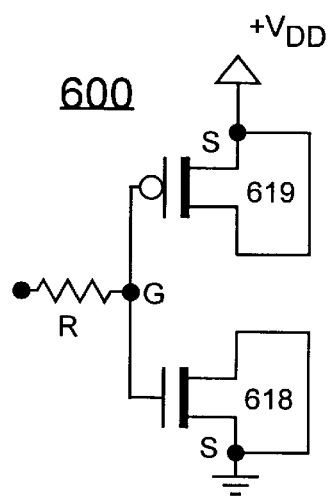
FIG. 6A is a schematic diagram of a previously-used, NMOS/PMOS capacitor circuit.

To remedy the above problem, one previously-used solution has employed the CMOS arrangement 600 of FIG. 6A. Here, the source and drain of NMOS transistor 618 are both tied to ground while the source and drain of PMOS transistor 619 are both tied to $+V_{DD}$. The gates of both transistors 618 and 619 are tied to node G.

Figure 6B:
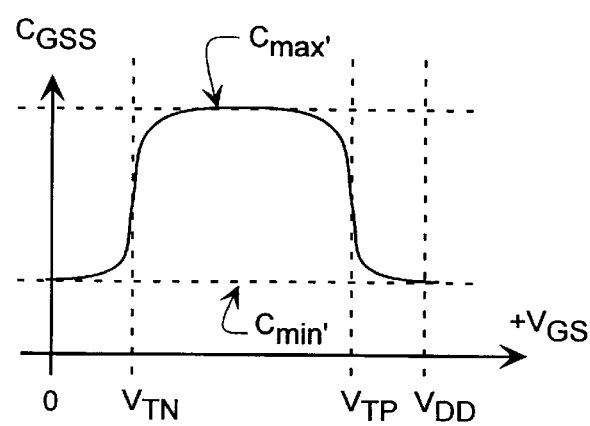
FIG. 6B is a graph of $C_{GS}$ versus $V_{GS}$ showing change of capacitance around the $V_{TN}$ and $V_{TP}$ points of the NMOS/PMOS capacitor circuit of FIG. 6A.

In corresponding FIG. 6B, $V_{TN}$ represents the threshold voltage of NMOS transistor 618. $V_{TP}$ represents the threshold voltage of PMOS transistor 619. When $V_{GS}$ is below $V_{TN}$, at least PMOS transistor 619 is turned on so that its conductive channel region defines a minimum capacitance value $C_{min'}$. When $V_{GS}$ is in the range between $V_{TN}$ and $V_{TP}$, both of transistors 618 and 619 are turned on. Their combined, carrier-populated channels provide for a maximum capacitance value of $C_{max'}$. When $V_{GS}$ is above $V_{TP}$, the PMOS transistor 619 turns off but the NMOS transistor 618 remains turned on. Thus, at least the minimum capacitance of the turned-on channel of NMOS transistor 618 continues to be provided. This combination of mechanisms provides for the single-hump shape of the resulting gate-to-dual sources capacitance, $C_{GSS}$ shown in FIG. 6B.

One disadvantage of the dual-transistor circuit 600 of FIG. 6A is that it consumes more circuit space than does a single-transistor counterpart such as that shown in FIG. 5A. Although the minimum capacitance $C_{min'}$ of circuit 600 is greater than the minimum capacitance of circuit 500 for all values of $V_{GS}$, the resulting capacitance value $C_{GSS}$ is still not generally flat for all values of $V_{GS}$ in the range 0V to $+V_{DD}$.

Figure 7A:
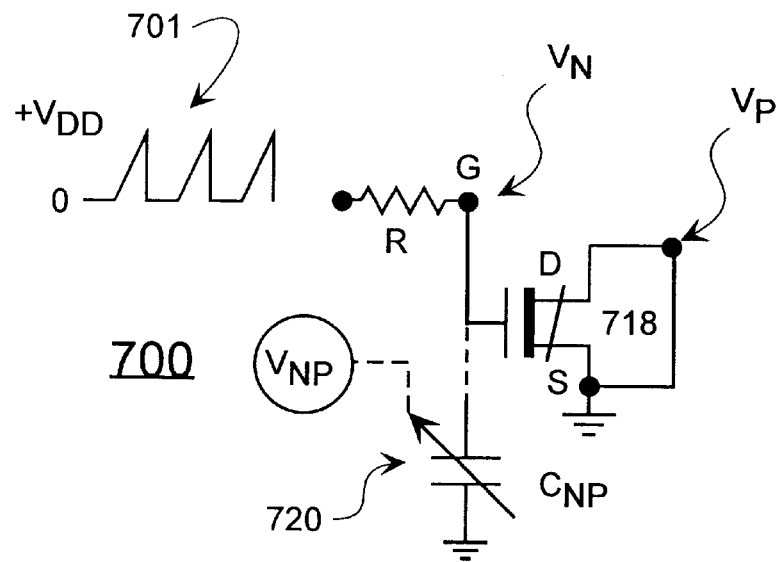
FIG. 7A is a schematic diagram of an SOS capacitor circuit in accordance with the invention.

FIG. 7A provides a schematic of an RC circuit 700 that employs an SOS capacitor 718 in accordance with the invention. Notations for drain (D) and source (S) are provided merely as familiar landmarks corresponding to conventional NMOS devices. SMOS capacitor 718, however, cannot function as an enhancement mode NMOS device. Accordingly, a slanted slash mark is included in its symbol to so indicate. The voltage at the gate layer portion (G) of SOS capacitor 718 is denoted as $V_N$. The voltage at the substrate contact points (107) of SOS capacitor 718 is denoted as $V_P$. As before, schematic symbol 720 is not part of the physical circuit 700, but rather represents an alternative way of viewing SOS capacitor 718. Its gate-to-substrate capacitance $C_{NP}$ may vary as a function of the gate-to-substrate voltage $V_{NP}$.

Figure 7B:
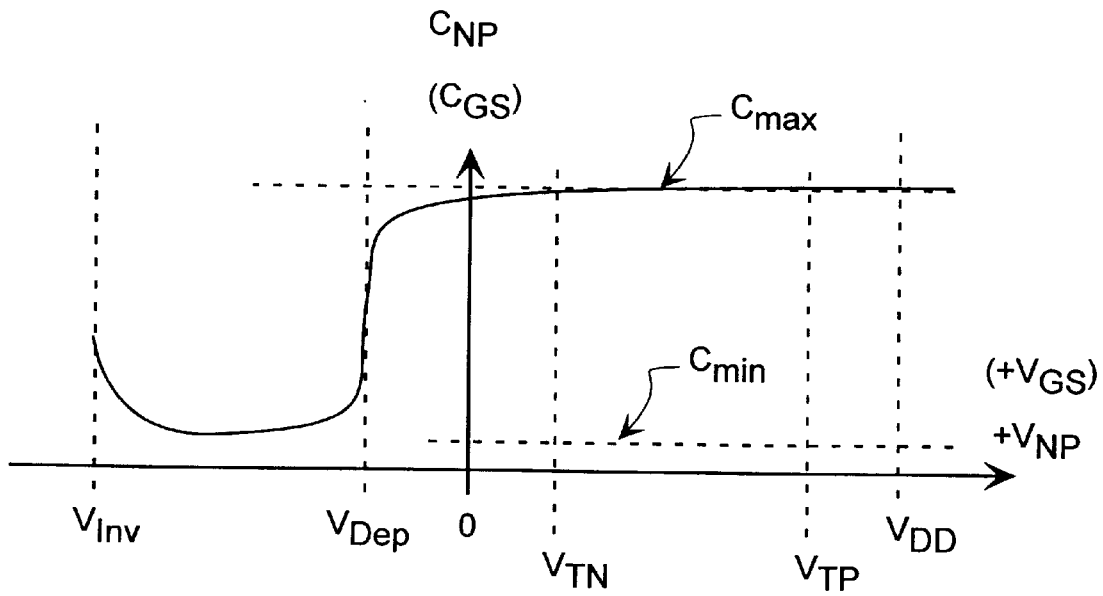
FIG. 7B is a graph of $C_{GS}$ ($C_{NP}$) versus $V_{GS}$ ($V_{NP}$) showing essentially no change of capacitance for the SOS capacitor of FIG. 7A around the $V_{TN}$ and $V_{TP}$ points of the corresponding integrated circuit.

In the corresponding capacitance versus voltage graph of FIG. 7B, lines $V_{TN}$ and $V_{TP}$ represent the threshold points of conventional NMOS and PMOS devices (not shown) within the same integrated circuit monolith in which SOS capacitor 718 is implemented. However, as seen, the depletion voltage point ($V_{Dep}$) of the channel portion (105a) of SOS capacitor 718 is substantially below $T_{TN}$ and preferably also below 0V. Accordingly, the capacitance $C_{NP}$ of SOS capacitor 718 remains substantially flat, at least in the range where $V_{NP}$ swings between 0V and $+V_{DD}$. $V_{NP}$ may also go slightly negative until it approaches $V_{Dep}$ before capacitance $C_{NP}$ drops to its minimum value $C_{min}$. If $V_{NP}$ is made more and more negative, eventually inversion will occur in the channel region (105a) and capacitance will increase again as indicated at the $V_{Inv}$ line.

Figure 8A:
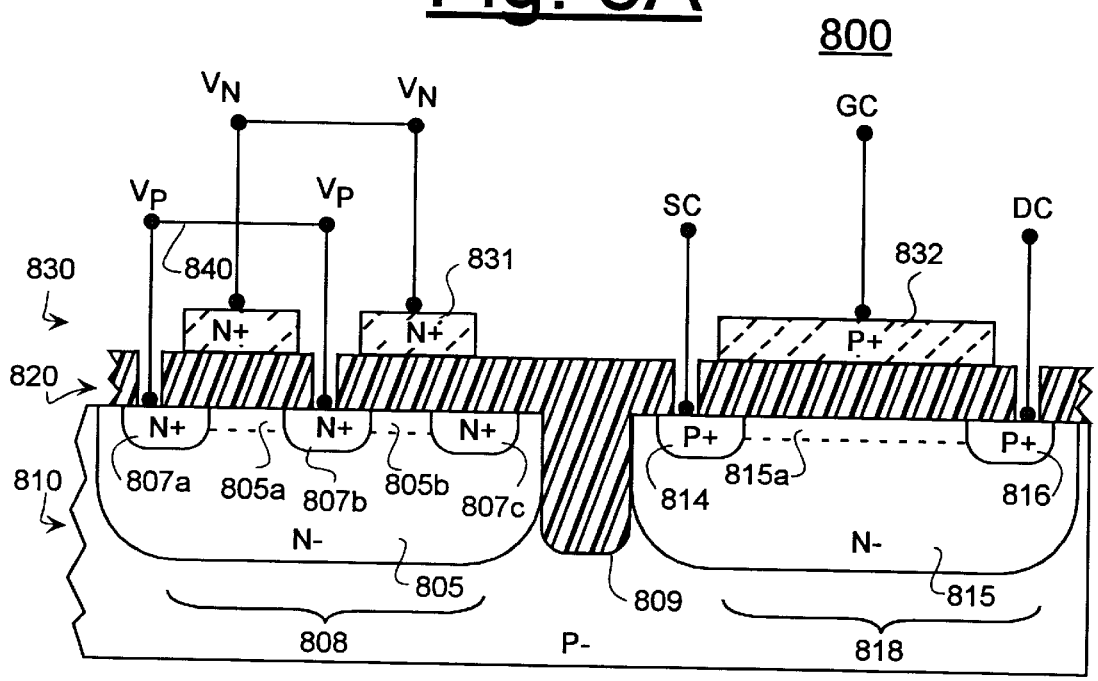
FIG. 8A is a cross-sectional side view of a second integrated circuit (IC) device in accordance with the invention having an SOS capacitor.

The cross-sectional view of FIG. 8A shows a preferred way for implementing SOS capacitors having large surface area. (Regerence numbers in the '800' century series are used in FIG. 8A to correspond with reference numerals in the '100' century series of FIG. 1 so that generally-alike elements do not have to be detailed again.) In FIG. 8A, the light doping of N– well 805 causes the SOS capacitor 808 which it forms to have a parasitic, series resistance of some finite value due to the sheet resistance of the N– material. To reduce this parasitic, series resistance, multiple N+ contact regions such as 807a, 807b and 807c are preferably made within N– well 805 using the same implant as for the source/drain regions (114/116) of neighboring NMOS transistors (see 118 of FIG. 1). A metal interconnect 840 may be used to straps these N+ contact points together to define one node of the SOS capacitor 808. N+ gate electrode 831 forms the opposed, other electrode of the SOS capacitor. The N+ gate electrode 831 is heavily doped with the same fabrication implant step used to form the source/drain regions (114/116) of neighboring NMOS transistors.

Field-oxide region 809 separates SOS capacitor 808 from an adjacent PMOS transistor 818. (FOX 809 was planarized after its growth. The FOX growth created isolated active regions such as that of SOS capacitor 808 and PMOS transistor 818.) PMOS device 818 has P+ doped source and drain regions, 814 and 816 as well as a P+ doped, polysilicon gate 832. N– well 815 was formed with the same well-fabricating step and has the same doping gradient and/or dosage as that of N– well 805 so that both may be fabricated simultaneously with a same one or more process steps. Gate insulator layer 820 is thermally grown, from among other substrate parts, from N– wells 805 and 815.

Figure 8B:
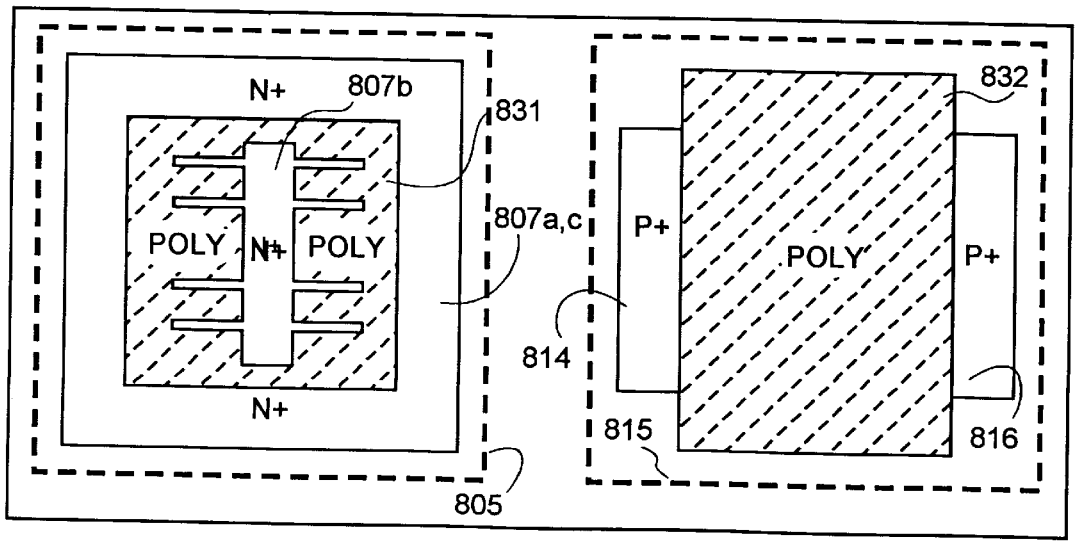
FIG. 8B is a top view of the second IC device showing the SOS capacitor and an adjacent P-channel transistor.

In the exemplary top view of FIG. 8B, the N+ island 807b may include elongated projections for reducing the parasitic series resistance of N– areas 805a, 805b, etc. to an acceptable level. The illustrated top view geometry is merely an example and other configurations may be used. As one example, the N+ contact regions 807a–807c may instead define a single spiral pattern when seen from atop.

The above disclosure is to be taken as illustrative of the invention, not as limiting its scope or spirit. Numerous modifications and variations will become apparent to those skilled in the art after studying the above disclosure.

By way of example, the arrangement of FIG. 1 may be modified by reversing all the illustrated conductivity types. Elements 131, 105 and 107 would then all be of the same P conductivity type and their common, majority charge carriers would be holes instead of electrons. The N conductivity type arrangement shown in FIG. 1 is preferred for high frequency applications because electrons have greater mobility than holes.

By way of yet another example, the thin gate oxide of FIG. 1 could be replaced or supplemented by a thicker oxide so as to increase the breakdown voltage of the capacitor and also increase its $V_{deplete}$ level. The doping process for N– well 105 may be additionally modified so as to provide an N+ well in the lateral center of area 105 surrounded by an N– guard well. The more lightly-doped N– guard well may be used to increase the reverse breakdown voltage of the PN junction formed by well 105 and the surrounding P– portion of substrate 110.

Given the above disclosure of general concepts and specific embodiments, the scope of protection sought is to be defined by the claims appended hereto.

What is claimed is:

1. A method for forming an integrated circuit with a capacitor structure disposed therein, where due to said formation the integrated circuit further includes one or more MOS transistors each having a respective gate insulator section, said method comprising the steps of:
   (a) providing a first conductive semiconductor element having a respective first conductivity type in the integrated circuit;
   (b) providing a spaced apart second conductive semiconductor element of the same first conductivity type in the integrated circuit; and
   (c) providing in the integrated circuit an insulator for disposition between said first and second semiconductor elements and for thereby forming said capacitor structure with the first and second semiconductor elements serving as plates of the capacitor structure, wherein said providing of the insulator simultaneously provides the respective gate insulator sections of the one or more MOS transistors of said integrated circuit.

2. A method according to claim 1 for forming a capacitor structure, wherein said one or more MOS transistors each has a gate electrode and wherein:
   (b.1) said step of providing the second conductive semiconductor element simultaneously provides a material that defines the respective gate electrodes of the one or more MOS transistors.

3. A method for forming a capacitor structure in a CMOS integrated circuit that is to also have a PMOS transistor and a NMOS transistor, where the PMOS transistor is to be formed in a N-type well and with a P-type gate; where the NMOS transistor is to be formed with a N-type, source/drain implant and with a N-type gate; and where a gate insulator layer is to be simultaneously formed for the PMOS and NMOS transistors, said method comprising the steps of:
   (a) at the same time that said N-type well of the PMOS transistor is defined, also defining a N-type well for serving as a first conductive semiconductor element of the to-be-formed capacitor structure;
   (b) at the same time that said N-type source/drain implant for the NMOS transistor is carried out, also implanting N-type contact regions in said first conductive semiconductor element of the to-be-formed capacitor structure;
   (c) forming an insulator atop said first semiconductor element and atop the N-type well of the PMOS transistor;
   (d) at the same time that material for said gates of the NMOS and PMOS transistors is deposited, also depositing material for a second semiconductor element of the to-be-formed capacitor structure; and
   (e) at the same time that the gate material of the NMOS transistor is doped to be N-type, also doping the material of the second semiconductor element to be N-type.

4. A method for forming a capacitor structure in an integrated circuit that is to also have a plurality of NMOS transistors formed therein; where the integrated circuit has a substrate and where the NMOS transistors are to be each formed with N-type, source and drain regions and with a N-type gate, and a P-type channel, and with a gate insulator disposed between the gate and the channel; said method comprising:

(a) providing a first N-type region in the substrate for defining a first plate portion of the capacitor structure;

(b) providing a first P-type region in the substrate for defining a channel of at least one of said NMOS transistors;

(c) forming an insulator layer for extending over said first N-type region and said first P-type region;

(d) forming an electrode layer extending over said insulator layer and above said first N-type region and said first P-type region; and (e) patterning the electrode layer to thereby define a first patterned portion of the electrode layer, where the first patterned portion is patterned for forming a second plate portion of the capacitor structure, the second plate portion being disposed above and separated from the first plate portion at least by said insulator layer, where said patterning further defines a second patterned portion of the electrode layer, where the second patterned portion is patterned for forming a gate of the at least one of said NMOS transistors, the gate being disposed above and separated from the channel of the at least one of said NMOS transistors at least by said insulator layer; and (f) causing each of the first and second patterned portions of the electrode layer to have N-type conductivity.

5. The capacitor forming method of claim 4 wherein:

(a.1) said providing of the first N-type region includes implanting N-type dopants into said substrate before said insulator layer is formed.

6. The capacitor forming method of claim 5 wherein:

(c.1) said forming of the insulator layer includes thermally growing insulative material from the first N-type region and from the first P-type region.

7. The capacitor forming method of claim 6 wherein:

(d.1) said forming of the electrode layer includes depositing a semiconductor material by CVD on said insulator layer.

8. The capacitor forming method of claim 7 wherein:

(f.1) said causing each of the first and second patterned portions of the electrode layer to have N-type conductivity includes simultaneously doping each of the first and second patterned portions with N-type dopants.

9. The capacitor forming method of claim 5 wherein:

(a.1a) said implanting N-type dopants includes implanting N-type dopants with different energies and different densities to thereby define a graduated N-well having more negative charge carriers near its top than near its bottom.

10. The capacitor forming method of claim 4 wherein:

(f.1) said causing each of the first and second patterned portions of the electrode layer to have N-type conductivity further includes:

(f.2) causing a central part of the second patterned portion of the electrode layer to have P-type conductivity for attracting more electrons into an underlying portion of the first N-type region.

11. The capacitor forming method of claim 4 wherein:

(e.1) said patterning the electrode layer to thereby define the first patterned portion further includes continuing the first patterned portion into direct connection with the gate of the at least one of said NMOS transistors.

12. The capacitor forming method of claim 4 and further comprising:

(g) simultaneously forming a heavily doped, N-type contact region overlapping with the first N-type region and heavily doped, N-type source and drain regions for said at least one of the NMOS transistors.

13. The capacitor forming method of claim 12 wherein:

(g.1) said contact region surrounds the first N-type region.

14. The capacitor forming method of claim 12 wherein:

(g.1) said contact region spirals into the first N-type region.

15. The capacitor forming method of claim 12 wherein:

(g.1) said contact region has a plurality of elongated arms projecting into the first N-type region.

16. The capacitor forming method of claim 12 wherein:

(g.1) said contact region and said source and drain regions respectively formed to be self-aligned respectively to the first and second patterned portions of the electrode layer.

17. The capacitor forming method of claim 12 wherein:

(g.1) said contact region is formed to extend continuously into direct connection with one of said source and drain regions.

18. A method for forming a capacitor structure in an integrated circuit that is to also have a plurality of NMOS transistors and PMOS transistors formed therein; where the integrated circuit has a substrate, where the NMOS transistors are to be each formed with N-type, source and drain regions and with a N-type gate, and a P-type channel region, and with a gate insulator disposed between the N-type gate and the P-type channel, and where the PMOS transistors are to be each formed with P-type, source and drain regions and with a P-type gate, and a N-type channel region, and with a respective gate insulator disposed between the P-type gate and the N-type channel region; said method comprising:

(a) providing a first N-type region in the substrate for defining a first plate portion of the capacitor structure;

(b) providing a second N-type region in the substrate for defining a respective channel of at least one of said PMOS transistors;

(c) providing a first P-type region in the substrate for defining a channel of at least one of said NMOS transistors;

(d) forming an insulator layer for extending over said first and second N-type regions and over said first P-type region;

(e) forming an electrode layer extending over said insulator layer and above said first and second N-type regions and said first P-type region; and (e) patterning the electrode layer to thereby define a first patterned portion of the electrode layer, where the first patterned portion is patterned for forming a second plate portion of the capacitor structure, the second plate portion being disposed above and separated from the first plate portion at least by said insulator layer, where said patterning further defines a second patterned portion of the electrode layer, where the second patterned portion is patterned for forming a gate of the at least one of said NMOS transistors, the gate being disposed above and separated from the channel of the at least one of said NMOS transistors at least by said insulator layer, where said patterning further defines a third patterned portion of the electrode layer, where the third patterned portion is patterned for forming a respective gate of the at least one of said PMOS transistors, the respective gate being disposed above and separated from the channel of the at least one of said PMOS transistors at least by said insulator layer;

(f) causing each of the first and second patterned portions of the electrode layer to have N-type conductivity; and (g) causing the third patterned portion of the electrode layer to have P-type conductivity.

19. The capacitor forming method of claim 18 wherein:

(a.1) said providing of the first N-type region occurs simultaneously with said providing of the second N-type region.

20. The capacitor forming method of claim 18 wherein:

(a.1) said providing of the first N-type region uses same materials as does said providing of the second N-type region.

21. A capacitor forming method as set forth in claim 18 and further including a circuit forming method comprised of:

(h) coupling one of the first and second plate portions of said capacitor structure to an output of a CMOS circuit formed in said integrated circuit, where the output of the CMOS circuit is structured to swing a substantially full extent between predefined $V_{DD}$ and ground levels of the CMOS circuit.

22. The capacitor and circuit forming method of claim 21 and further including:

(i) coupling the other of the first and second plate portions of said capacitor structure to a reference defining circuit formed in said integrated circuit, where the reference defining circuit defines a level shifting voltage for establishment across said capacitor structure.

* * * * *